United States Patent
Ohkawa et al.

(10) Patent No.: US 7,592,655 B2
(45) Date of Patent: Sep. 22, 2009

(54) MOS IMAGE SENSOR

(75) Inventors: Narumi Ohkawa, Kawasaki (JP);
Shigetoshi Takeda, Kawasaki (JP);
Yukihiro Ishihara, Kawasaki (JP);
Kazuki Hayashi, Kawasaki (JP);
Nobuhisa Naori, Kawasaki (JP);
Masahiro Chijiiwa, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 149 days.

(21) Appl. No.: 11/216,111

(22) Filed: Sep. 1, 2005

(65) Prior Publication Data
US 2006/0208289 A1   Sep. 21, 2006

(30) Foreign Application Priority Data
Mar. 17, 2005  (JP) .............................. 2005-076221

(51) Int. Cl.
*H01L 31/062* (2006.01)
(52) U.S. Cl. ................. 257/292; 257/291; 257/462; 257/E27.133; 257/E31.082
(58) Field of Classification Search ................. 257/233, 257/290–292, 461, 462, E27.133, E31.082, 257/E31.084
See application file for complete search history.

(56) References Cited

U.S. PATENT DOCUMENTS

| | | | |
|---|---|---|---|
| 5,101,253 A * | 3/1992 | Mizutani et al. ............. | 257/414 |
| 5,899,742 A | 5/1999 | Sun | |
| 6,180,535 B1 | 1/2001 | Wu et al. | |
| 6,441,412 B2 | 8/2002 | Oh et al. | |
| 6,607,951 B2 | 8/2003 | Chen et al. | |
| 6,657,665 B1 | 12/2003 | Guidash | |
| 7,005,689 B2 * | 2/2006 | Song et al. ................... | 257/290 |
| 2004/0021060 A1 * | 2/2004 | Ohkawa ................... | 250/214.1 |
| 2004/0141077 A1 | 7/2004 | Ohkawa | |

(Continued)

FOREIGN PATENT DOCUMENTS

JP   62-081758 A   4/1987

(Continued)

OTHER PUBLICATIONS

Taiwanese Office Action dated Nov. 20, 2006 issued in corresponding Taiwain patent application No. 09520964320.

(Continued)

*Primary Examiner*—Matthew E Warren
(74) *Attorney, Agent, or Firm*—Westerman, Hattori, Daniels & Adrian, LLP.

(57) ABSTRACT

A semiconductor image sensor includes: a semiconductor substrate having a number of pixels disposed in a matrix shape, the semiconductor substrate comprising a first region including a charge accumulation region of a photodiode and a floating diffusion and a second region including transistors, each having a gate electrode and source/drain regions; a first silicon oxide film formed above the semiconductor substrate, covering the surface of the charge accumulation region in the first region and formed as side wall spacers on side of the gate electrode walls of at lease some transistors in the second region; and a silicon nitride film formed above the first silicon oxide film, covering the source/drain regions in the second region and having an opening at least in an area above the charge accumulation region in the first region. The semiconductor image sensor is provided which has a high sensitivity and can supply an output with small noises.

15 Claims, 12 Drawing Sheets

U.S. PATENT DOCUMENTS

| | | |
|---|---|---|
| 2004/0169127 A1 | 9/2004 | Ohkawa |
| 2005/0269605 A1* | 12/2005 | Yaung ........................ 257/291 |
| 2007/0108475 A1* | 5/2007 | Mouli ........................ 257/225 |

FOREIGN PATENT DOCUMENTS

| | | |
|---|---|---|
| JP | 62-81758 A | 4/1987 |
| JP | 07-045805 A | 2/1995 |
| JP | 11-191623 A | 7/1999 |
| JP | 2000-232216 A | 8/2000 |
| JP | 2004-095636 A | 3/2004 |
| JP | 2004-095966 A | 3/2004 |
| JP | 2004-165236 | 6/2004 |
| JP | 2004165236 A * | 6/2004 |
| JP | 2004207433 A * | 7/2004 |
| JP | 07-045805 A | 4/2009 |

OTHER PUBLICATIONS

Japanese Office Action dated Mar. 10, 2009 issued in corresponding Japanese Application No. 2005-076221.

Office Action issued in Japanese Appln. No. 2005-076221, dated Nov. 11, 2008.

* cited by examiner

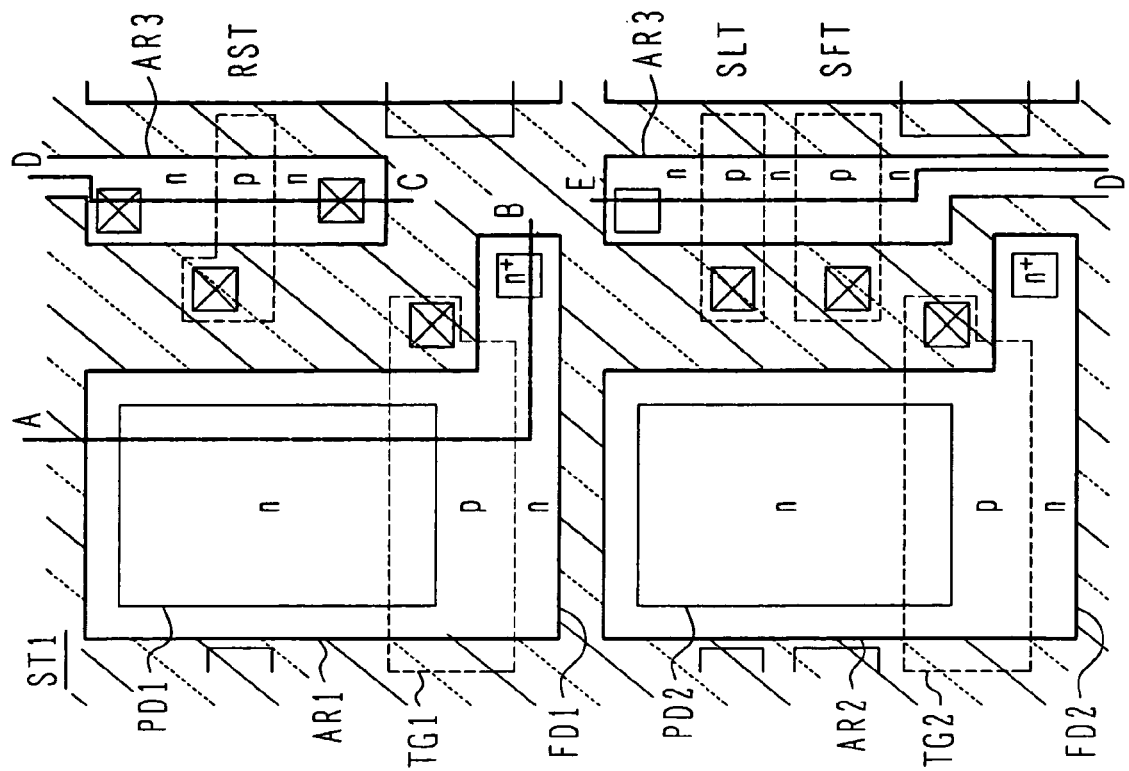
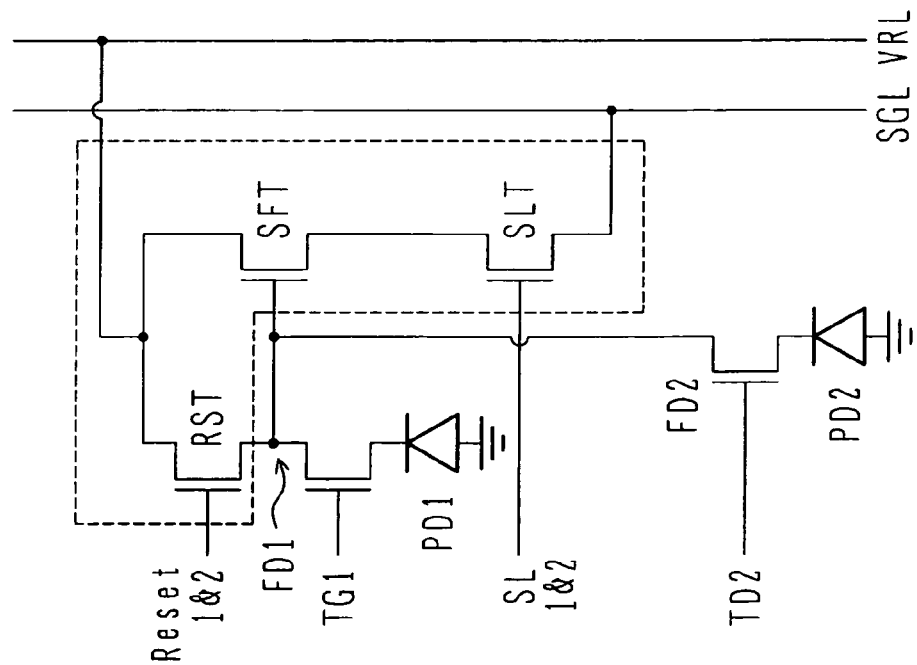
FIG.2A
FIG.2B

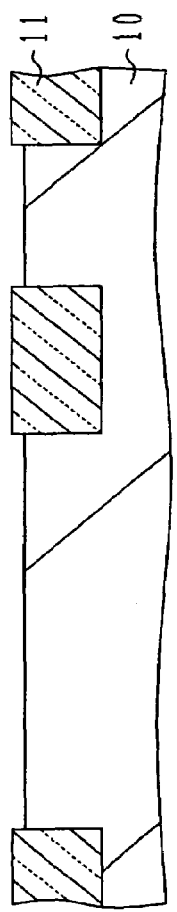
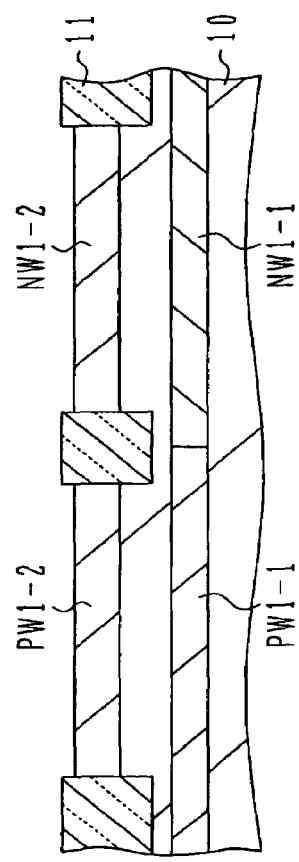
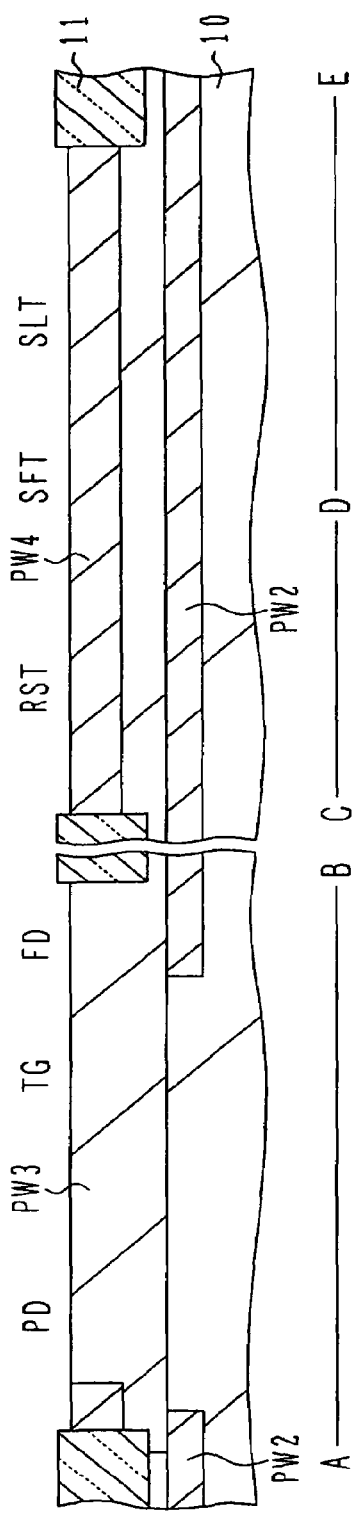
FIG.5A
FIG.5B
FIG.5C

| G | R | G | R |
|---|---|---|---|
| B | G | B | G |
| G | R | G | R |
| B | G | B | G |

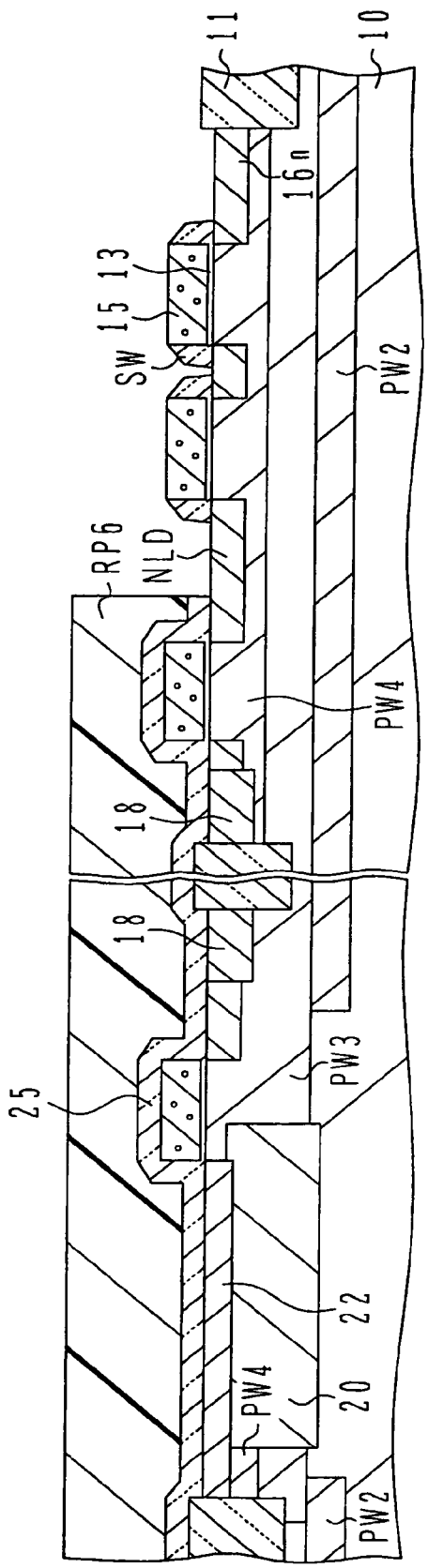
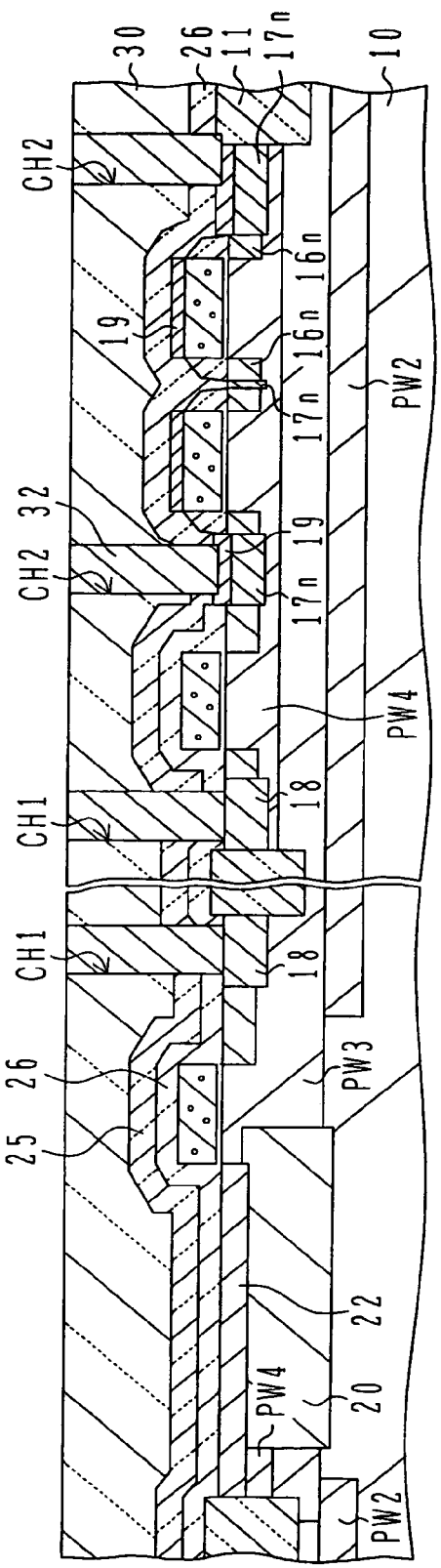
FIG. 7A
FIG. 7B

MOS IMAGE SENSOR

CROSS REFERENCE TO RELATED APPLICATION

This application is based on and claims priority of Japanese Patent Application No. 2005-076221 filed on Mar. 17, 2005, the entire contents of which are incorporated herein by reference.

BACKGROUND OF THE INVENTION

A) Field of the Invention

The present invention relates to a semiconductor device, and more particularly to a semiconductor device having semiconductor photodiodes as photoelectric conversion elements and insulated gate type transistors.

B) Description of the Related Art

As an image sensor, semiconductor image sensors are widely used which have semiconductor photodiodes as photoelectric conversion elements. There are two types of semiconductor image sensors: a CCD type semiconductor image sensor having charge coupled devices for detecting and transferring charges; and a MOS type image sensor having a charge detection circuit including MOS transistors for detecting charges. A transistor having a gate insulating film not made of only a single oxide film is also called herein MOS transistor. A MOS type semiconductor image sensor has an advantage that a consumption power can be reduced.

FIG. 1A is a schematic plan view showing the structure of a MOS type semiconductor image sensor. Pixels PX having photoreceptors are disposed in a pixel area in a matrix shape. In the structure shown, a transfer line TL, a reset line RL and a select line SL are disposed in parallel in a row direction, and a voltage line VRL and a signal read line SGL are disposed in parallel in a column direction. A vertical driver V-DRIVE drives each line, and a horizontal driver H-DRIVE reads signal voltage in each column. Signal voltage in pixels in each row are read, noises are cancelled in each column, and the signal voltage are amplified, A/D converted and subjected to other necessary processing.

FIG. 1B shows an example of the structure of a pixel PX. This example shows a 4Tr active pixel sensor (APS) in which one pixel is constituted of one photodiode PD and four MOS transistors. Anodes of photodiodes of all pixels are made of a common p-type well. A cathode (n-type region) of the photodiode PD constitutes a charge accumulation region. The cathode accumulates electrons among pairs of electrons and holes generated by photoelectric conversion of incidence light in the photodiode PD.

A transfer transistor TRT has as its source the cathode of the photodiode and as its drain a floating diffusion FD which is an n-type region in an electrically floating state in a p-type region. A transfer gate TG of the transfer transistor TRT controls charge transfer between the source and drain. As a transfer signal is supplied from the transfer line TL to pixels PX in the same row at the timing when an image sensing period is terminated, signal charges accumulated in the photodiodes PD in the row are transferred to corresponding floating diffusions FD.

A source follower transistor SFT and a select transistor SLT are serially connected, and their gates are connected to the floating diffusion FD and the select line SL, respectively. The floating diffusion FD generates a voltage V=Q/C where Q is transferred charges and C is a capacitance, and supplies an output corresponding to the accumulated charges to the gate of the source follower transistor SFT.

When a select signal is supplied from the select line SL to pixels in the same row, an output signal from each source follower transistor SFT is supplied to the signal read line SGL via the select transistor SLT. The signal charges after its read operation is completed become unnecessary. When an on-signal is supplied from the reset line to each reset transistor RST in the same row, charges in the floating diffusion FD are drained to the voltage line VRL via the reset transistor RST.

FIG. 1C is a timing chart illustrating a pixel drive operation. This timing chart shows changes in the signal TG applied to the gate of the transfer transistor TRT, in a signal RST applied to the gate of the reset transistor RST, in a signal SL applied to the gate of the select transistor SLT, in an output signal SGL supplied from SLT to the output signal line SGL and in a voltage FD at the floating diffusion FD (at the gate of the source follower transistor SFT).

As the gate voltage of the select transistor is made high, the select transistor enters an on-state capable of transferring an output voltage of the source follower transistor SFT. The gate voltage of the reset transistor RST is once made high to drain noise charges in the floating diffusion FD and prepare for a signal read operation. As the voltage of RST changes, a change in the voltage of a positive polarity occurs at the floating diffusion FD and source follower transistor SFT, i.e., at the output voltage SGL.

TG is made high at the timing when the image sensing period is terminated and the transfer transistor TRT is turned on to transfer charges accumulated in the photodiode PD to the floating diffusion FD. A change in the potential of a positive polarity occurs also at the floating diffusion FD and signal read line SGL, because of a change in the TG voltage. After stabilization, a potential at the floating diffusion FD having the capacitance C changes by $\Delta V=Q/C$ because of the read charges Q. This potential change is converted into an output signal by the source follower transistor SFT, and the output signal is read to the read line SGL. Thereafter, the potential of the select line SL becomes low to terminate a read operation.

After pixel structures of a semiconductor image sensor are formed, an interlayer insulating film is formed on the upper surface of the semiconductor substrate and contact plugs connected to the electrodes of transistors are formed through the interlayer insulating films. In order to form contact plugs on electrodes of a transistor, it is necessary to first form contact holes through the interlayer insulating film. It is preferable to form an etch stopper such as a silicon nitride film under the interlayer insulating film, in order not to damage the semiconductor substrate. In order to reduce noises of a photodiode and improve an image quality, it is desired to lower an interfacial level. To this end, it is desired to execute hydrogenation treatment. A silicon nitride film has a function of shielding hydrogen during hydrogenation treatment. Therefore, if contact holes are to be formed properly, the image quality is hindered.

Japanese Patent Laid-open Publication No. 2004-165236 proposes to deposit a silicon nitride film as an etch stopper by low pressure (LP) CVD and remove the silicon nitride film in a region above photodiodes and the like where the silicon nitride film is not necessary. This Publication explains that since contact holes can be formed properly because of the existence of the etch stopper, and since hydrogen can reach the surface of a semiconductor substrate from the region where the etch stopper is removed, dark current can be suppressed by hydrogen treatment to improve the image quality.

A semiconductor image sensor is desired to have a high sensitivity and an output with small noises.

SUMMARY OF THE INVENTION

An object of this invention is to provide a semiconductor image sensor capable of having a high sensibility and an output with small noises.

According to one aspect of the present invention, there is provided a semiconductor image sensor comprising: a semiconductor substrate having a number of pixels disposed in a matrix shape, the semiconductor substrate including a first region having a charge accumulation region of a photodiode and a floating diffusion and a second region having a transistor with a gate electrode and source/drain regions; a first silicon oxide film formed above the semiconductor substrate, covering a surface of the charge accumulation region in the first region and formed as side wall spacers on side walls of at lease some transistors in the second region; and a silicon nitride film formed above the first silicon oxide film, covering the source/drain regions in the second region and having an opening at least in an area above the charge accumulation region in the first region.

It is possible to form side wall spacers on the side walls of the gate electrode of a transistor and cover the surface of the photodiode with the silicon oxide film. An etch stopper of the silicon nitride film is formed on the source/drain regions of the transistor. While the silicon nitride film on the photodiode is removed, the silicon oxide film protects the photodiode. As hydrogenation treatment is executed, hydrogen can reach the substrate via the opening of the silicon nitride film on the photodiode.

The sensitivity was improved and noises were reduced in samples really formed.

BRIEF DESCRIPTION OF THE DRAWINGS

FIGS. 2A and 2B are an equivalent circuit diagram and a plan view briefly explaining the structure of a semiconductor image sensor according to a first embodiment.

FIGS. 5A to 5I and FIGS. 5S to 5V are cross sectional views illustrating manufacture processes for the semiconductor image sensor shown in FIG. 3.

FIGS. 7A and 7B are schematic cross sectional views illustrating manufacture processes for a semiconductor image sensor according to a second embodiment.

DESCRIPTION OF THE PREFERRED EMBODIMENTS

Description will be made on samples manufactured by the present inventors and the performance of the samples confirmed by the present inventors.

FIG. 2A is an equivalent circuit diagram showing two pixels. Photodiodes PD1 and PD2 constitute two photoelectric conversion elements. The photodiodes PD1 and PD2 are coupled to floating diffusions FD1 and FD2 via transfer gates TG1 and TG2. One charge read circuit is used in common for two pixels. Namely, the floating diffusions FD1 and FD2 are connected together and this connection point is connected to the gate electrode of a source follower transistor SFT and to a reset voltage line VRL via a reset transistor RST. The drain of the source follower transistor SFT is connected to the voltage line VRL, and the source thereof is connected to a signal read line SGL via a select transistor SLT. The gate of the select transistor SLT receives both a first select signal SL1 and a second select signal SL2. Since the transfer gates TG1 and TG2 are not turned on at the same time, charges in the photodiodes PD1 and PD2 can be selectively read.

FIG. 2B is a schematic plan view showing the layout of a semiconductor substrate surface. An element isolation region surrounding active regions is formed by shallow trench isolation (STI). The photodiode PD1 and floating diffusion FD1 are formed in an active region AR1. A contact high impurity concentration region is formed in an area to the right of the floating diffusion FD1. In an area lower than the active region AR1, an active region AR2 is formed having the same structure as that of the active region AR1. The photodiode PD2 and floating diffusion FD2 are formed in an active region AR2. Transfer gates TG1 and TG2 for controlling charge transfer between the photodiodes and floating diffusions are indicated by broken lines.

In areas to the right of the active regions AR1 and AR2, an active region AR3 is defined constituting the charge read circuit. One active region AR3 is formed in common for two photodiodes. In the structure shown in FIG. 2B, the reset transistor RST is formed in an upper area and the select transistor SLT and source follower transistor SFT are formed in a lower area. A gate electrode formed above each transistor is indicated by a broken line. Cross sectional views taken along one-dot chain lines A-B and C-D-E are shown in FIG. 3.

Figure 1A:
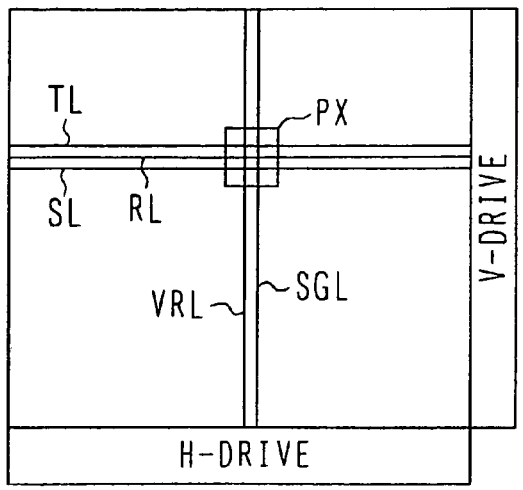
FIGS. 1A to 1C are a schematic plan view, an equivalent circuit diagram and a timing chart illustrating the structure and operation of a MOS type semiconductor image sensor.
Figure 1B:
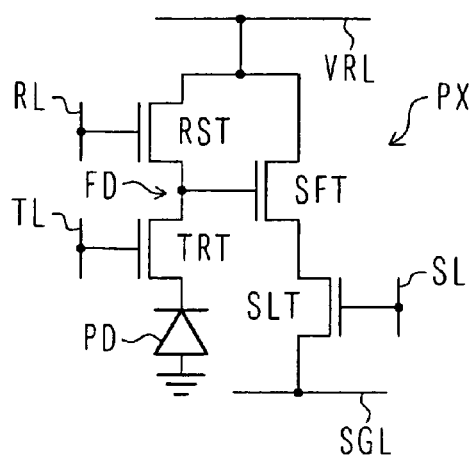
Figure 1C:
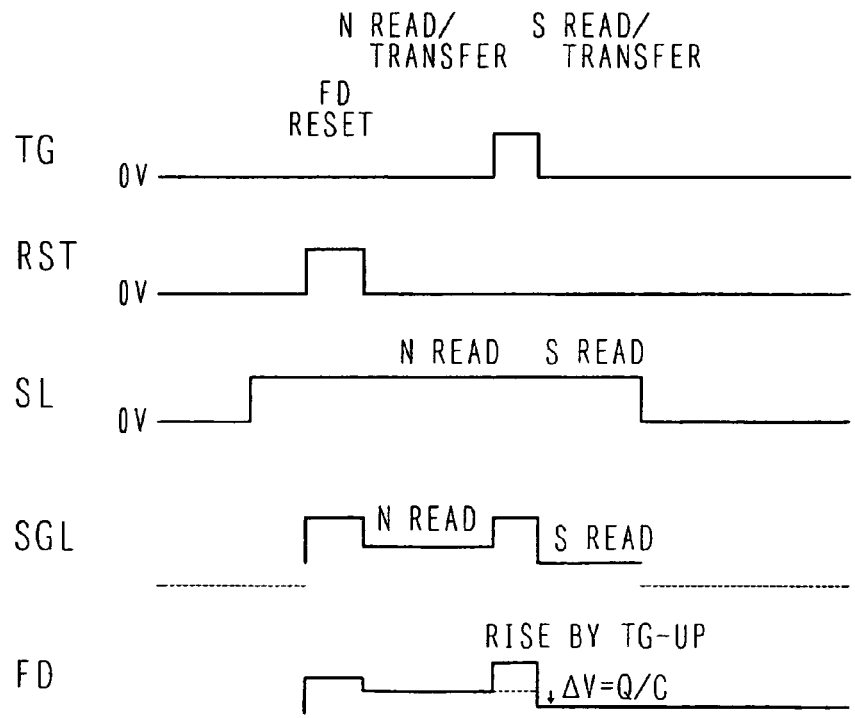
Figure 3:
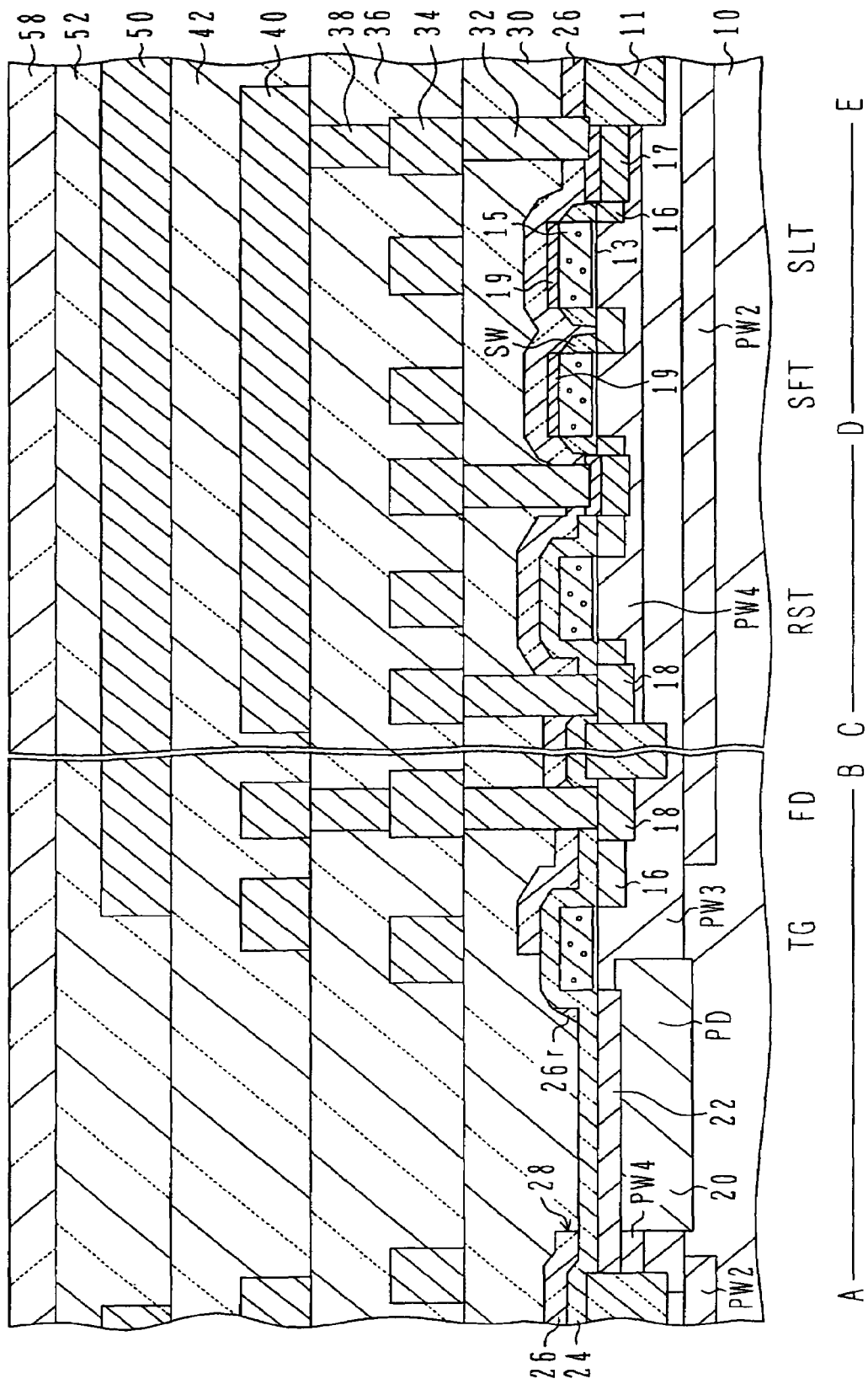
FIG. 3 is a schematic cross sectional view showing the structure of the semiconductor image sensor of the first embodiment.

FIG. 3 shows cross sectional structures of a sample pixel. A p-type silicon substrate 10 has a shallow trench isolation (STI) 11, and p-type wells PW2, PW3 and PW4 are formed in the substrate.

Figure 4A:
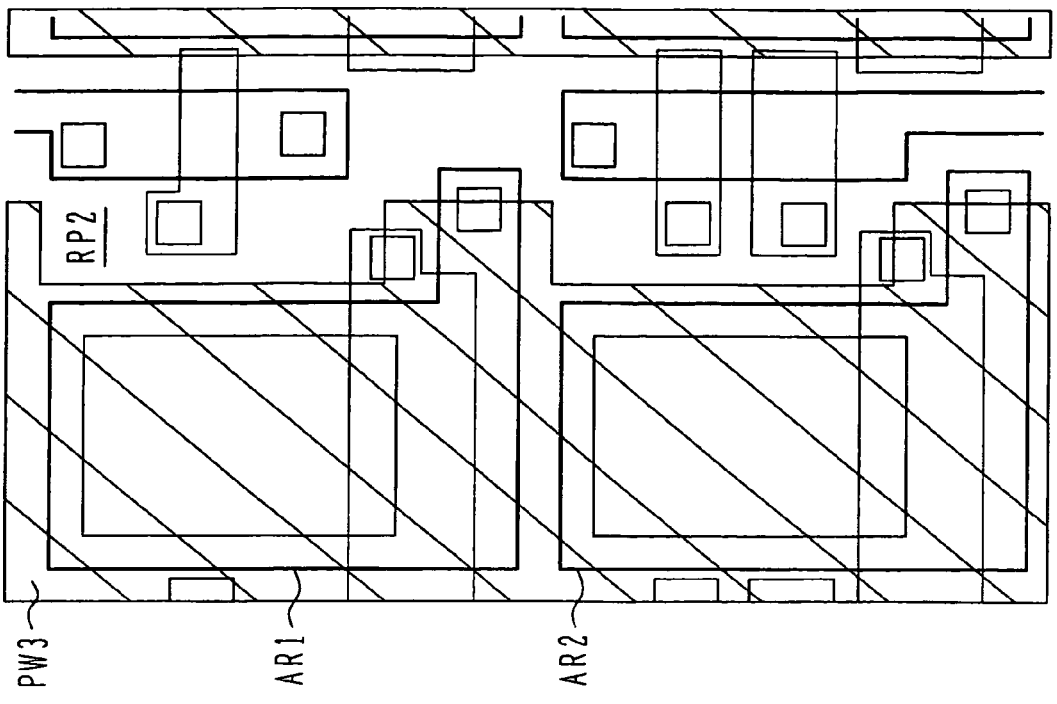
FIGS. 4A to 4F are schematic plan views showing the plan layout illustrating manufacture processes realizing the structure shown in FIG. 3.

FIG. 4A shows a resist pattern RP1 in a hatched area, the resist pattern being used for ion implantation into the p-type well PW1. The resist pattern RP1 perfectly covers the charge accumulation regions of the photodiodes in the active regions AR1 and AR2 and the channel regions in areas lower than the transfer gates TG, and exposes slightly stripe regions in upper areas of the active regions AR1 and AR2 and lower right areas of the contact region. In other words, the p-type well PW2 is formed surrounding the photodiode region and the channel region under the transfer gate.

In FIG. 3, an n-type region (charge accumulation region) 20 of the photodiode is formed in the p-type well PW3 constituting the anode of the photodiode.

Figure 4B:
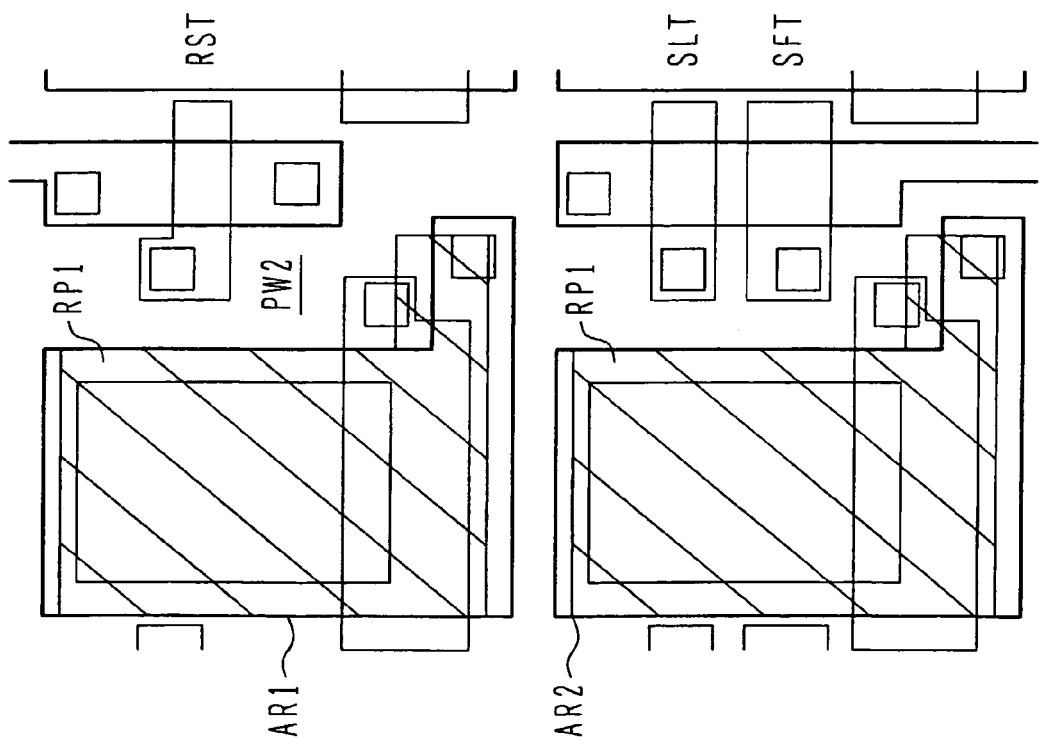

FIG. 4B shows the opening of a resist pattern RP2 in a hatched area, the resist pattern being used for ion implantation into the p-type well PW3. The p-type well PW3 is formed completely covering the charge accumulation regions 20 and channel regions under TGs, continuously in the active regions AR1 and AR2, except right hand side portions than an intermediate of the contact rejoin of FD.

In FIG. 3, the transistors RST, SFT and SLT of the charge read circuit are formed in the p-type well PW4.

Figure 4D:
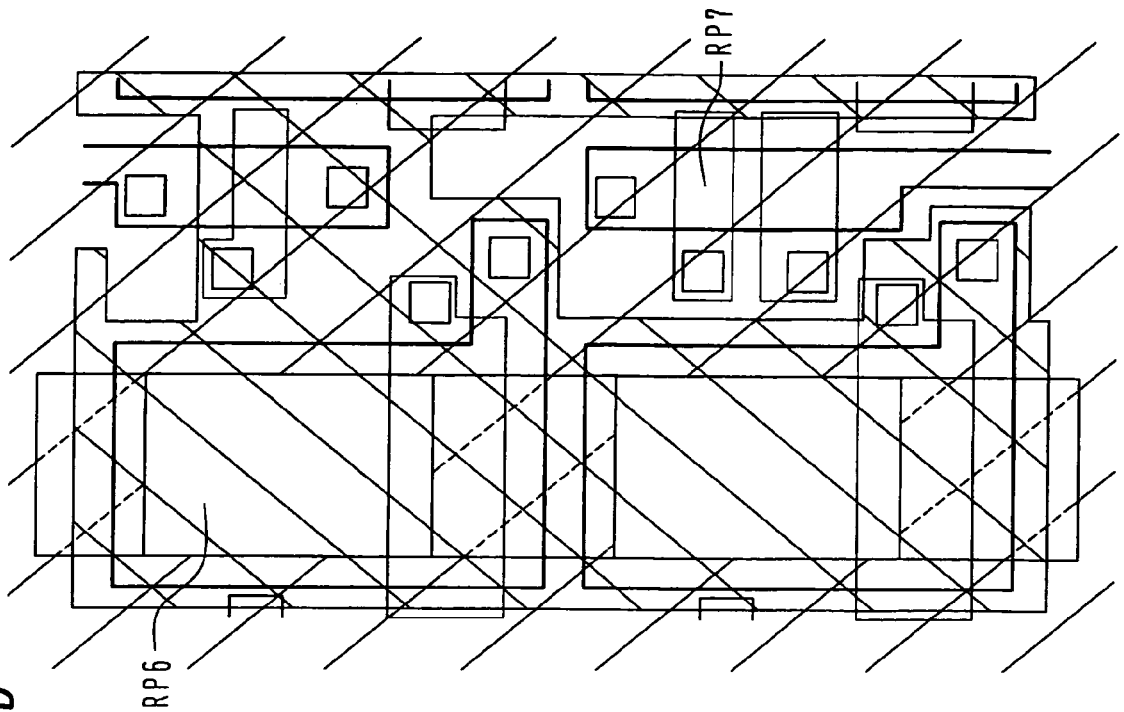
Figure 4C:
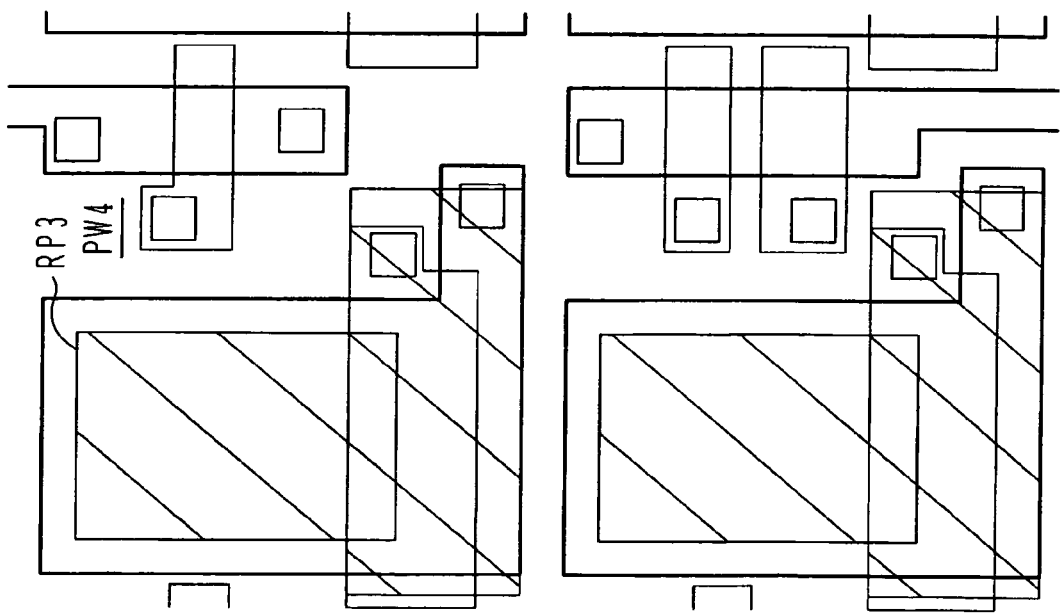

FIG. 4C shows a resist pattern RP3 in a hatched area, the resist pattern being used for ion implantation into the p-type well PW4. The resist pattern RP3 covers the n-type regions of the photodiodes, transfer gate regions and floating diffusion regions. An outer peripheral area of the charge accumulation region of each photodiode is not covered with the resist pattern but is exposed. Therefore, the p-type well PW4 includes the region surrounding the charge accumulation regions of the photodiodes and the region where the transistors of the charge read circuit are formed.

In FIG. 3, a p-type region 22 is formed on the charge accumulation region 20 of the photodiode to make the charge accumulation region 20 have a buried structure. Formed in the p-type well PW3 are the n-type charge accumulation region 20 of the photodiode, and a n-type floating diffusion region 16 and an n+-type contact region 18 respectively via the transfer gate TG.

On the surface of the active region, a gate insulating film 13 of silicon oxide and a gate electrode 15 of polysilicon are formed being patterned in a shape of each gate electrode. In the read circuit area, a low impurity concentration n-type region 16 is formed in the p-type well PW4 by using the gate electrode as a portion of a mask to thereby form source/drain regions of each transistor. The high impurity concentration contact region 18 is formed in the floating diffusion FD and in the drain of the reset transistor RST.

Side wall spacers SW are formed on the side walls of the gate electrodes of the source follower transistor SFT and select transistor SLT. A silicon oxide film 24 used for forming the side wall spacers SW is not etched but left on the photodiode PD, transfer gate TG, floating diffusion FD and reset transistor RST. High impurity concentration n-type regions 17 are formed in the source/drain regions of the source follower transistor SFT and select transistor SLT. A silicide layer 19 is formed on the source/drain regions of the source follower transistor SFT and select transistor SLT and on the gate electrodes.

A silicon nitride film 26 is formed on the silicon oxide film 24, and the silicon nitride film above the charge accumulation region 20 of the photodiode is removed. In the charge read circuit area, the silicon nitride film 26 covers the surfaces of the source/drain regions of the source follower transistor SFT and select transistor SLT. Namely, the silicon nitride film 26 can function as an etch stopper when contact holes are formed in this area.

FIG. 4D shows a resist pattern RP6 in a left descending hatched area to be used for etching the silicon oxide film 24, and a resist pattern RP7 in a right descending hatched area to be used for etching the silicon nitride film 26. The resist pattern RP6 leaves the silicon oxide film on the photodiode, and an opening of the resist pattern RP7 removes the silicon nitride film above the photodiode. In an area indicated by broken lines, although the silicon nitride film was not removed when samples were formed, the silicon nitride film may be removed. However, it is preferable to remove the silicon nitride film in order to efficiently execute hydrogenation treatment for the floating diffusion FD.

A first interlayer insulating film 30 of silicon oxide is formed on the silicon nitride film 26, and contact holes are formed through the first interlayer insulating film, reaching the source/drain regions of transistors and the contact region of the floating diffusion. Tungsten plugs 32 are buried in the contact holes. Since the etch stopper film 26 is formed on the substrate for the source follower transistor SFT and select transistor SLT, etching at a high precision is possible so that border-less contacts are formed. A W plug 32 shown to the right of the select transistor SLT has a border-less contact so that it shifts to the right of the source/drain regions and rides on STI 11. However, since high precision etching is possible by using the silicon nitride film 26 as an etch stopper, it is possible to prevent STI 11 from being etched deeply. For the contact region 18 of the floating diffusion FD and the contact regions of the source/drain regions of the reset transistor connected to the floating diffusion, the silicon oxide film 24 is left under the silicon nitride film 26. Therefore, this tungsten plug 32 is not a border-less contact so that a position alignment margin is set to, for example, about 0.1 μm.

First aluminum wirings 34 are formed on the first interlayer insulating film 30 and covered with a second interlayer insulating film 36 of silicon oxide, the surface of the second interlayer insulating film being planarized. Via holes are formed in the second interlayer insulating film 36 and via conductors 38 (W plugs) are buried in the via holes. Similarly, second aluminum wirings 40 are formed on the second interlayer insulating film 36 and covered with a third interlayer insulating film 42. If necessary, via conductors of W plugs are formed. A third aluminum wiring 50 is formed on the third interlayer insulating film and covered with an insulating film 52 of silicon oxide. A silicon nitride cover film 58 is formed on the insulating film 52. By using portions of the third aluminum wiring 50, pads are formed. The cover film 58 and insulating film 52 above and on the pads are removed.

Figure 4F:
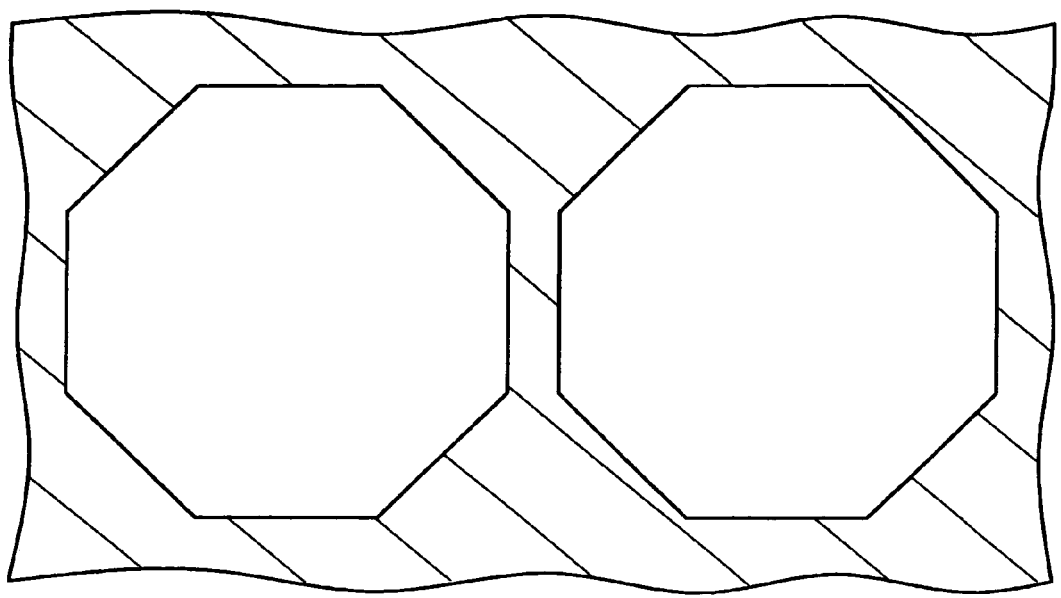
Figure 4E:
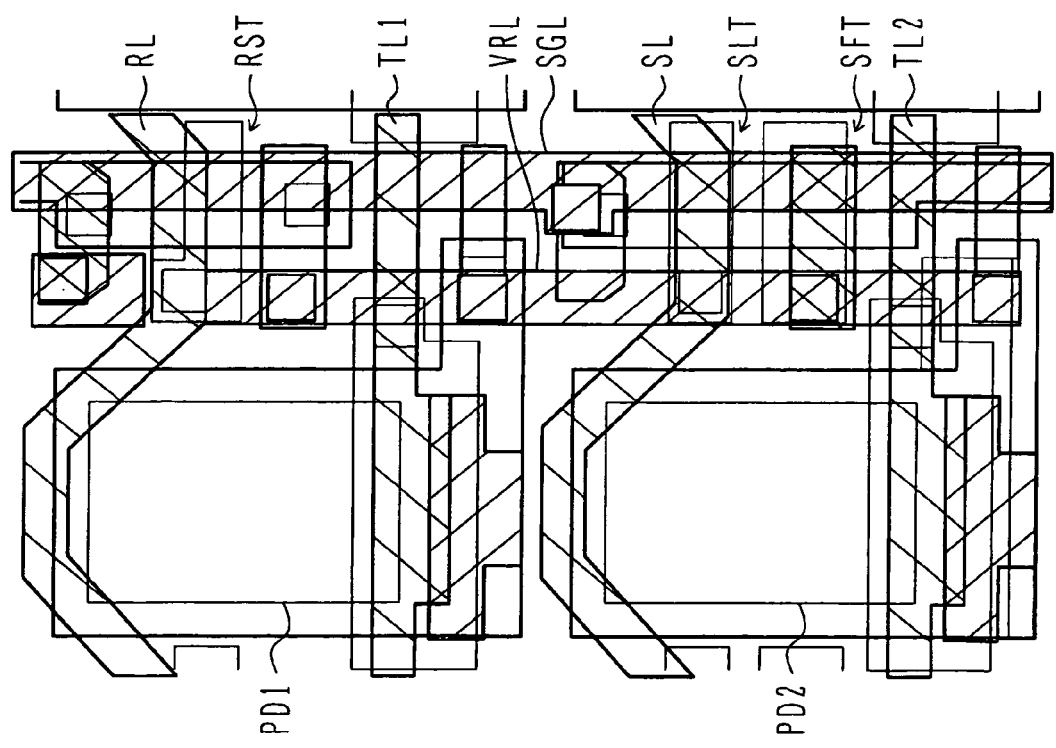

FIGS. 4E and 4F show the layout of first, second and third aluminum wirings. In FIG. 4E, left descending hatches indicate the first aluminum wirings, and right descending hatches indicate the second aluminum wirings. The reset line RL, transfer lines TL1 and TL2, select line SL and the like are formed by the first aluminum wirings. The voltage line VRL, signal line SGL and the like are formed by the second aluminum wirings. FIG. 4F shows the pattern of the third aluminum wiring. The third aluminum wiring constitutes a voltage supply plane and has openings above pixels to constitute a light shielding film.

In the structure described above, since the semiconductor surface is covered with the silicon oxide film in the photodiode area, damages of the semiconductor surface can be reduced during etching and removing the silicon nitride etch stopper film. Since the silicon nitride film is removed from the pixel area, attenuation of incidence light in the silicon nitride film can be prevented. The silicon oxide film in the photodiode area functions as a mask when the silicide layer is formed so that the silicide layer is not formed in the photodiode area. If the silicide layer is formed, this layer may become a source of noises.

In the charge read circuit area, the side wall spacers of silicon oxide insulator can be formed so that micro fine transistors can be formed. Since the silicide layer can be formed, a transistor capable of low resistance, high speed operation can be formed. In the charge read circuit area, since the etch stopper layer is formed covering the source/drain regions of transistors, high precision etching is possible so that border-less contacts can be adopted. Transistors can be formed efficiently in a narrow area.

With reference to FIGS. 5A to 5I and FIGS. 5S to 5V, description will be made on manufacture processes for the structure shown in FIG. 3.

As shown in FIG. 5A, a mask made of silicon nitride film is formed for forming a trench in the surface layer of a p-type silicon substrate 10. A trench is formed by etching the silicon substrate by about 400 nm, a silicon oxide film is formed and buried in the trench by high density plasma CVD, and an unnecessary portion is removed by chemical mechanical polishing (CMP) to thereby form an element isolation region 11 through shallow trench isolation (STI). The mask is thereafter removed.

As shown in FIG. 5B, in a peripheral circuit area, impurity ions are implanted to form a p-type well PW and an n-type well NW for forming a CMOS circuit. First, a mask for ion implantation into the p-type well is formed and B+-ions are implanted at an acceleration energy of 300 keV and a dose of $3 \times 10^{13}$ cm$^{-2}$ (hereinafter denoted as 3E13) to form a deep p-type well PW1-1. Next, B$^+$-ions are implanted at an acceleration energy of 30 keV, a dose of 5E12 and an incidence angle of 7 degrees to thereby form a threshold value adjusting p-type well PW1-2.

After the p-type well forming mask is removed, a mask for forming the n-type well is formed. First, P$^+$-ions are implanted at an acceleration energy of 600 keV and a dose of 3E13 to form an n-type well NW1-1. Next, As$^+$ ions are implanted at an acceleration energy of 160 keV, a dose of 2 to 3E13 and an incidence angle of 7 degrees to thereby form a threshold value adjusting n-type well NW1-2. In the following, the CMOS structure in the peripheral circuit will be described when necessary.

As shown in FIG. 5C, in a pixel area, a deep p-type well PW2 surrounding a photodiode area is formed by implanting B$^+$ ions at an acceleration energy of 300 keV and a dose of 1E13. A p-type well PW3 for forming the anode region of a photodiode is formed by implanting B$^+$ ions at an acceleration energy of 144 keV, a dose of 2E12 and an incidence angle of 7 degrees and further implanting B$^+$ ions at an acceleration energy of 30 keV, a dose of 2E12 and an incidence angle of 7 degrees. A dose is set about a half of that for the threshold value adjusting ion implantation in the peripheral circuit area. A threshold voltage Vt under the transfer gate TG is therefore set low.

In the charge read circuit area, B$^+$ ions are further implanted at an acceleration energy of 30 keV, a dose of 5E12 and an incidence angle of 7 degrees to form a threshold value adjusting p-type well PW4. This dose is approximately the same degree as that for the threshold value adjusting region of n-channel transistors in the peripheral circuit area.

Figure 5D:
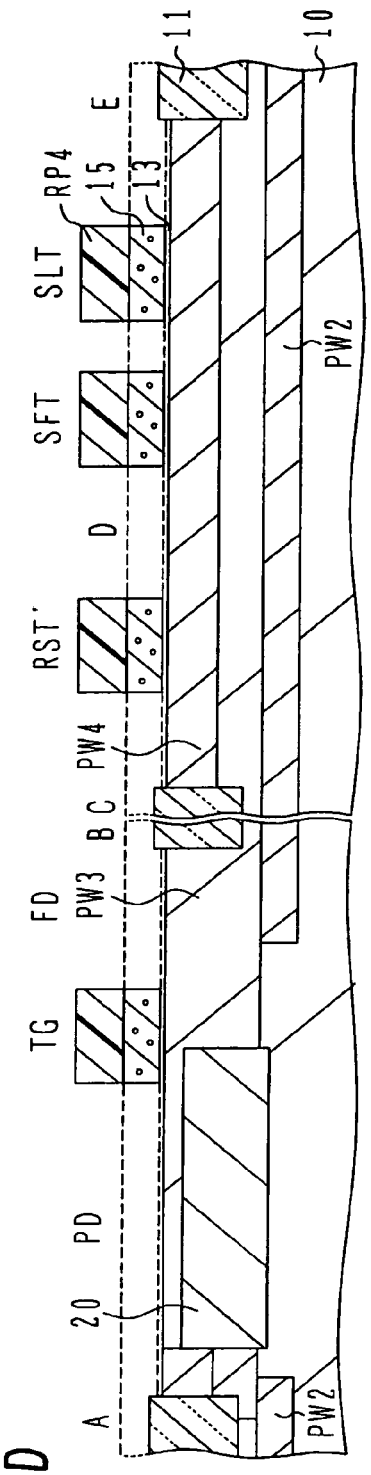

As shown in FIG. 5D, a mask is formed having an opening for exposing a charge accumulation region 20 of a photodiode, and an n-type region 20 surrounded by the p-type well PW3 is formed by implanting P$^+$ ions at an acceleration energy of 325 keV, a dose of 2E12 and an incidence angle of 7 degrees, further implanting P$^+$ ions at an acceleration energy of 207 keV, a dose of 2E12 and an incidence angle of 7 degrees, and furthermore implanting P$^+$ ions at an acceleration energy of 135 keV, a dose of 2E12 and an incidence angle of 7 degrees.

After the mask is removed and a clean semiconductor surface is exposed, a silicon oxide film 13 having a thickness of about 8 nm is formed by thermal oxidation at 800° C., and on the surface of the silicon oxide film, a polysilicon film 15 is deposited to a thickness of about 180 nm by CVD. Excepting the p-channel transistor area of the peripheral circuit, P$^+$ ions are implanted into the polysilicon film 15 at an acceleration energy of 20 keV, a dose of 4E15 and an incidence angle of 7 degrees to form a low resistance n-type polysilicon layer 15. Thereafter, annealing is performed at 800° C. for 60 minutes to activate implanted impurity ions.

A resist pattern RP4 is formed on the polysilicon layer 15, and the polysilicon layer 15 is etched to form insulated gate electrode structures. The resist pattern RP4 is thereafter removed.

Figure 5E:
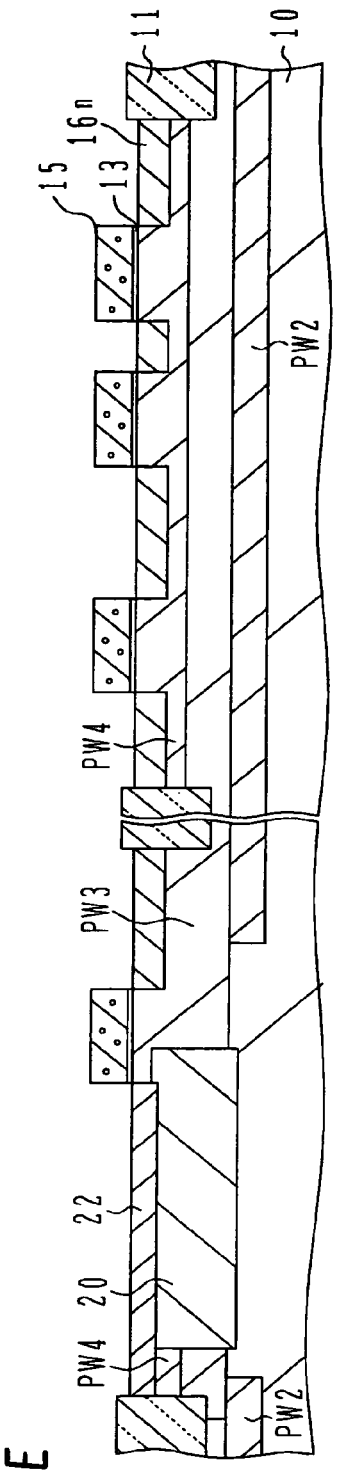

As shown in FIG. 5E, the photodiode region and the p-channel transistor regions of the peripheral circuit are covered with a resist mask, and P$^+$ ions are implanted at an acceleration energy of 20 keV and a dose of 4E13 to form low impurity concentration source/drain diffusion layers 16n (LDD or extension). A resist pattern having an opening in a region corresponding to the photodiode region is formed, and B$^+$ ions are implanted at an acceleration energy of 10 keV, a dose of 1 to 2E13 and an incidence angle of 7 degrees to form a p-type diffusion layer 22 burying the photodiode. Since a pn junction of the charge accumulation region 20 is positioned away from the silicon substrate surface, noises can be suppressed.

Figure 5F:
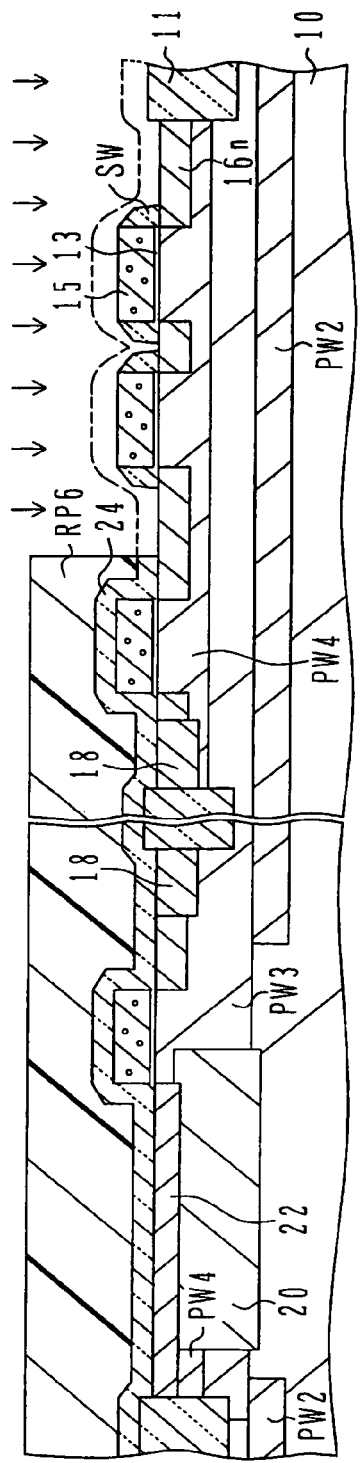
Figure 5G:
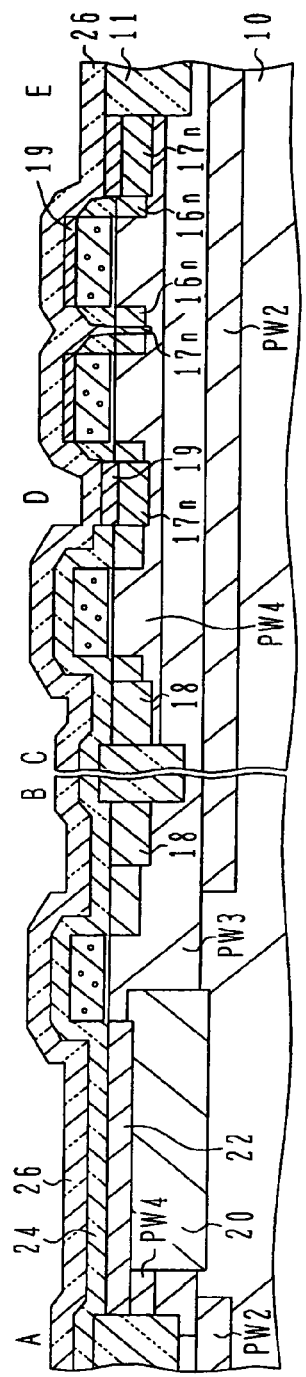
Figure 5H:
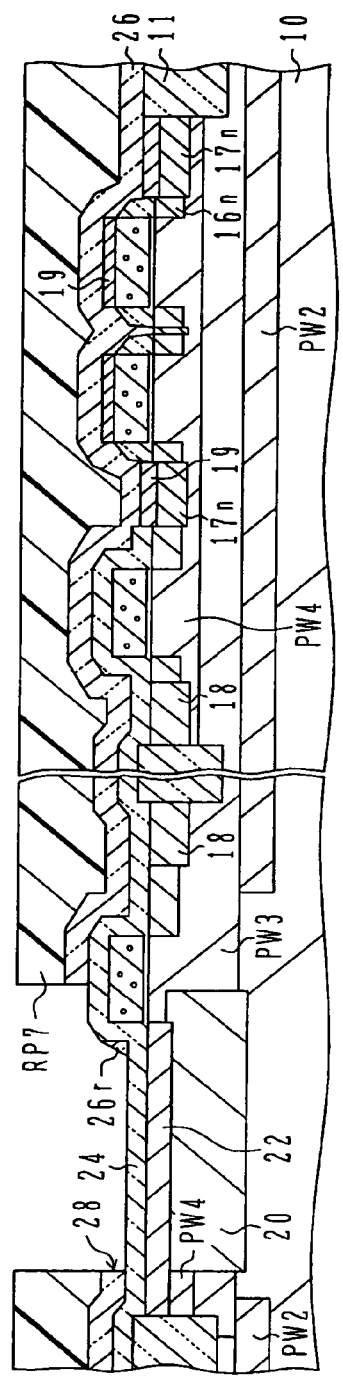
Figure 5I:
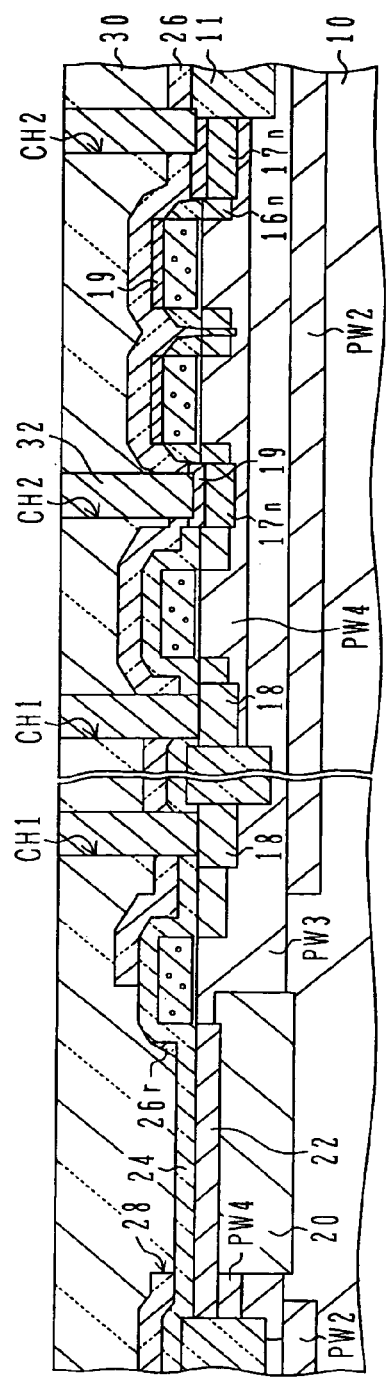
Figure 5S:
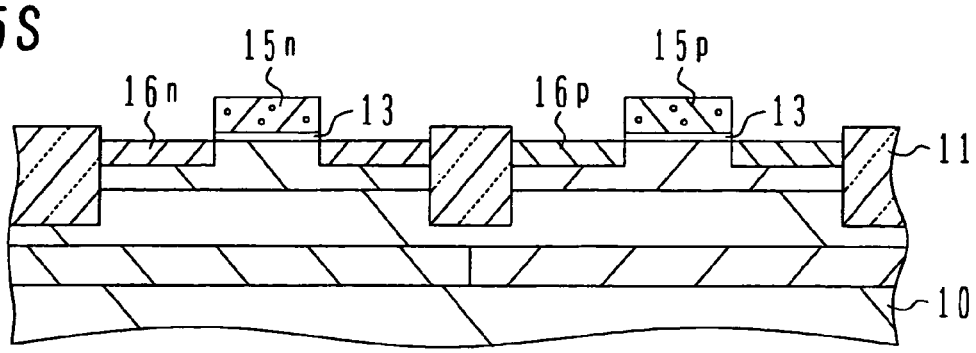

FIG. 5S shows the state that insulated gate electrode structures are formed in the peripheral circuit area and extension regions 16n and 16p are formed on both sides of each insulated gate electrode structure. For example, the extension region 16p can be formed by implanting B$^+$ ions at an acceleration energy of 7 keV and a dose of about 1 to 2E13.

As shown in FIG. 5F, a resist mask having openings in regions corresponding to the floating diffusion region and the contact region of the reset transistor is formed, and P$^+$ ions are implanted at an acceleration energy of 15 keV and a dose of 2E15 to form an n-type high impurity concentration region 18. The resist mask is thereafter removed.

An HTO silicon oxide film 24 is deposited to a thickness of about 100 nm by high temperature CVD at about 750° C. A resist pattern RP6 is formed covering the photodiode, floating diffusion FD and reset transistor RST, and the silicon oxide film 24 is anisotropically etched by reactive ion etching (RIE) to leave side wall spacers only on the gate electrode side walls. The resist pattern RP6 is thereafter removed. With these processes, the side wall spacers are formed on the gate electrode side walls of desired transistors in the charge read circuit and peripheral circuit, and the surfaces of the photodiode, floating diffusion and reset transistor are covered with the silicon oxide film 24 functioning as a mask for a silicidation process. The silicon oxide film 24 also functions as a protective film for a later etching process.

As shown in FIG. 5G, the p-channel transistor regions of the peripheral circuit are covered with a resist pattern, and P$^+$ ions are implanted at an acceleration energy of 13 keV and a dose of 2E15 to form high impurity concentration regions 17n.

Figure 5T:
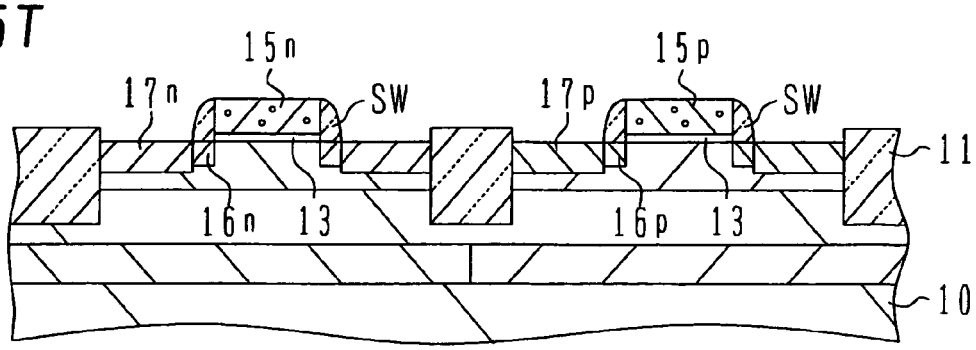

FIG. 5T shows the peripheral circuit area. After side wall spacers SW of silicon oxide are formed on the gate electrode side walls, n-type high impurity concentration source/drain regions 17n are formed by the above-described n-type impurity ion implantation. By covering the pixel area and n-channel transistor regions of the peripheral circuit with a resist mask, B$^+$ ions are implanted at an acceleration energy of 5 keV and a dose of 2E15 to form p-type high impurity concentration regions 17p. The resist pattern is thereafter removed. Rapid thermal annealing (RTA) is performed at 1000° C. for about 10 seconds to activate implanted impurity ions.

Reverting to FIG. 5G, silicon surface is processed with hydrofluoric acid. Although the left silicon oxide film 24 is thinned by the hydrofluoric acid process and the like, the silicon oxide film 24 having a thickness of about 60 nm is left at this stage. Thereafter, a Co film is formed by sputtering and RTA is performed at about 520° C. for several tens seconds to make the Co film silicidate with the underlying silicon surface and to form primary silicide films. An unreacted Co film on the oxide film is washed out by SCI washing or with ammonium hydrogen peroxide solution to leave only the silicide films. RTA is performed at about 840° C. for several tens seconds to change the silicide films to low resistance silicide films 19. Since the silicon surface is not exposed in the area where the silicon oxide film 24 is left, silicide layers are not formed. After the silicide layers 19 are formed, a silicon nitride film 26 is deposited to a thickness of about 70 nm on the whole substrate surface by CVD.

Figure 5U:
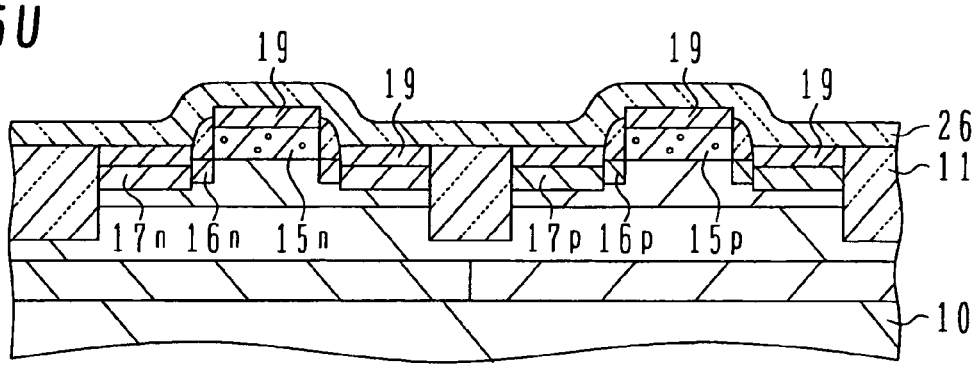

FIG. 5U shows the structure of the peripheral circuit area after the silicon nitride film 26 is formed. Each transistor has the side wall spacers SW formed on the gate electrode side walls, the extensions 16, the high impurity concentration source/drain regions 17, and the silicide layers 19 on the source/drain regions and gate electrode.

As shown in FIG. 5H, a resist pattern RP7 is formed having an opening extending in the region corresponding to the charge accumulation region 20 of the photodiode and floating diffusion region, and the silicon nitride film 26 is etched to form an opening 28 in the silicon nitride film 26. Etching is performed by using $O_2$+$CHF_3$ as etchant and at an etching rate ratio of about 2.5 between the oxide film and nitride film. After the silicon nitride film having a thickness of 70 nm is etched and removed and over-etching of 30% is performed, a thickness reduction in the oxide film is about 9 nm. Since the silicon oxide film having a thickness of about 50 nm is left, damages during etching and removing the silicon nitride film can be efficiently prevented. The silicon nitride film 26 on a partial surface of the transfer gate is removed so that a side wall 26r of silicon nitride is left on the side of the transfer gate TG in the opening 28. The resist pattern RP7 is thereafter removed.

As shown in FIG. 5I, a silicon oxide film 30 is deposited on the whole substrate surface to a thickness of about 1000 nm by plasma CVD using tetraethyl orthosilicate (TEOS) as source material. Thereafter, CMP is performed to planarize the surface of the silicon oxide film. First, contact holes are etched by using a resist pattern having openings in regions corresponding to the floating diffusion region and the contact region of the reset transistor. Namely, the silicon oxide film 30 is etched by using $C_4F_8$+Ar as etchant, and this etching is stopped on the surface of the silicon nitride film 26. Etchant gas is changed to $O_2$+$CHF_3$ to etch the silicon nitride film 26 and silicon oxide film 24. This etching is performed with a position alignment margin. In this manner, contact holes CH1 are formed reaching the contact regions 18.

Next, in order to form contact holes for the source/drain regions of each transistor, a resist pattern is formed and the silicon oxide film 30 and silicon nitride film 26 are etched. The silicon oxide film 30 is etched by using $C_4F_8$+Ar as etchant gas, and the silicon nitride film is etched by using $O_2$+$CHF_3$ as etchant gas. This etching can be performed highly precisely with a border-less contact because the silicon surface is covered with the etch stopper. In this manner, contact holes CH2 are formed.

After the contact holes CH1 and CH2 are formed, a Ti layer having a thickness of about 30 nm and a TiN layer having a thickness of about 50 nm are formed by sputtering, and then a W layer having a thickness of about 300 nm is formed by CVD. Unnecessary metal layers on the insulating film are removed to form W plugs 32. After the W plugs 32 are formed, hydrogen annealing is performed at 450° C. for about 60 minutes.

Figure 5V:
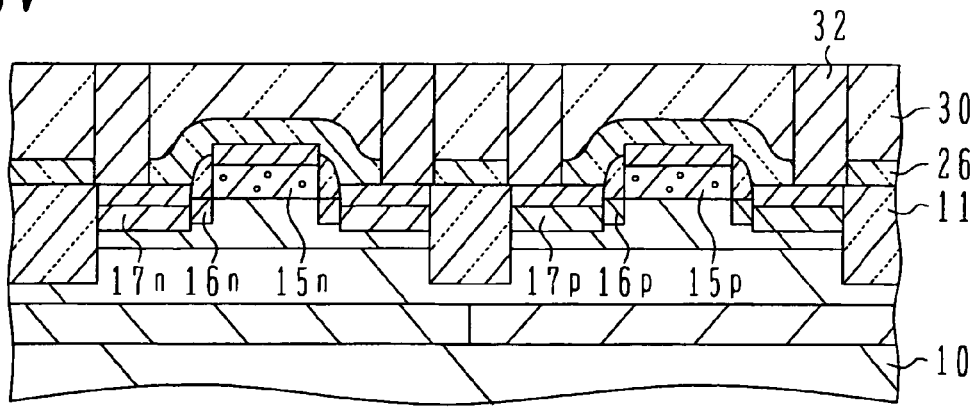

FIG. 5V shows the state that W plugs are formed in the peripheral circuit area. The W plugs 32 on the source/drain regions are formed with border-less contacts.

As shown in FIG. 3, a Ti layer having a thickness of about 30 nm, a TiN layer having a thickness of 50 nm, an Al layer having a thickness of about 400 nm, a Ti layer having a thickness of about 5 nm and a TiN layer having a thickness of about 50 nm are formed on the first interlayer insulating film 30 by sputtering. A wiring pattern is formed by photolithography and etching process to form the first metal wirings 34. A silicon oxide film is formed to a thickness of about 750 nm, covering the first metal wirings 34, by high density plasma CVD with a good burying performance. On this silicon oxide film, a plasma TEOS oxide film is deposited to a thickness of about 1100 nm. The surface of the TEOS oxide film is planarized by CMP and the second interlayer insulating film 36 is formed thereon. A resist pattern is formed for via contacts, and via holes reaching the first metal wirings 34 are formed. W plugs 38 are buried in the via holes by the processes similar to those described above.

The second metal wirings 40 are formed by the processes similar to those described above, and the third interlayer insulating film 42 is formed covering the second metal wirings 40. After W plugs are formed by similar processes, the third metal wiring 50 is formed on the third interlayer insulating film 42. A portion of the third metal wiring 50 constitutes pads. The insulating film 52 having the same structure as the above-described interlayer insulating film is formed, and after the surface thereof is planarized, the cover film 58 of silicon nitride is deposited to a thickness of about 500 nm by plasma CVD. The cover film 58 and insulating film 52 in the pad area are removed to expose the pads. After the pads are exposed, hydrogen annealing is performed at 400 to 450° C. for about 30 to 60 minutes.

With the above-described processes, samples were formed. For the purposes of comparison, comparative samples were also formed by not removing the silicon nitride film on the photodiode. Both samples were measured and compared. The samples with the silicon nitride film on the photodiode being removed, had a sensitivity increase by about 25% and a dark current reduction by about 20%. The sensitivity was measured by performing first image sensing having a short exposure time and second image sensing having a long exposure time, respectively at a constant light amount in the range not saturating the photodiode, and by calculating a signal amount per unit (exposure) time obtained by dividing a signal difference between first and second image sensing by an exposure time difference. The dark current was measured by performing first image sensing having a short exposure time and second image sensing having a long exposure time, respectively in a dark state without light, and by calculating a signal amount per unit (exposure) time obtained by dividing a signal difference between first and second image sensing by an exposure time difference (a signal increasing with time in the dark state was assumed to be a dark current). A sensitivity of 550 mV/LX sec and a dark current of 0.175 fA with the silicon nitride film was improved to a sensitivity of 700 mV/LX sec and a dark current of 0.14 fA without the silicon nitride film.

One reason of the sensitivity improvement may be ascribed to that since the silicon nitride film on the photodiode is removed, light attenuation is suppressed and reflection is reduced due to reduction in optical interface. However, it is indefinite that the sensitivity improvement by 25% can be elucidated only by this reason. It can be considered that by removing the silicon nitride film on the photodiode, hydrogen is sufficiently introduced into the substrate by the hydrogen annealing so that a dark current and leak current are reduced and noises are suppressed. Since the silicon surface of the photodiode is protected with the silicon oxide film, it can be considered that damages of the silicon surface are suppressed also during etching and removing the silicon nitride film.

A border-less contact can be realized in the area where the side wall spacers of silicon oxide are formed and the silicon nitride film is formed on the semiconductor surface. In this area, micro fine design rules can be adopted. A border-less contact was able to be realized even if a silicon oxide film having a thickness of about 20 nm was deposited under the silicon nitride film 26 by plasma CVD and a silicon nitride film having a thickness of about 70 nm was deposited on the silicon oxide film by plasma CVD. It is expected that a thickness of the silicon oxide film formed under the silicon nitride film is desired to be set to 30 nm or thinner in order to realize the border-less contact.

In the above-described samples, the third metal wiring 50 has an opening above the photodiode PD and functions as a light shielding film covering the other area. Although color filters and micro lenses are not formed in the above embodiment, these may obviously formed.

Figures 6A, 6B:
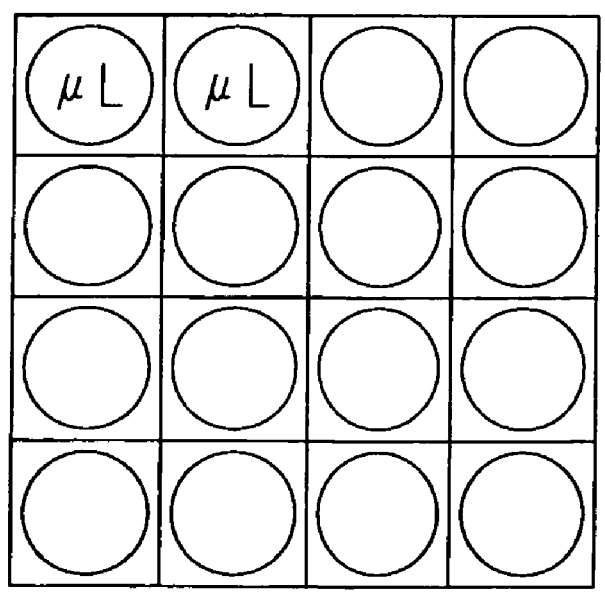
FIGS. 6A and 6B are schematic plan views showing the layouts of color filter layers and micro lenses of the semiconductor image sensor shown in FIG. 3.

As shown in FIG. 6A, after a planarizing film is formed on the structure shown in FIG. 3, color filters are formed on the planarized surface. FIG. 6A shows briefly the Bayer layout of R, G and B. Color filters can be formed by forming each of R, G and B layers and patterning each layer. After color filters are formed, a planarizing film is formed to planarize the surface thereof.

As shown in FIG. 6B, a resist layer is formed on the planarizing layer and patterned into circle shapes. The left resist layers are heated to flow them. The surface of each resist layer becomes spherical and forms a lens shape, because of the surface tension. In this manner, micro lenses μL are formed.

In the above-described embodiment, although the side wall spacers of each transistor are made of silicon oxide, the side wall spacers may be made of silicon nitride.

FIGS. 7A and 7B illustrate manufacture processes for a semiconductor image sensor according to the second embodiment. First, the processes shown in FIGS. 5A to 5E are executed in the manner similar to the first embodiment. Instead of depositing the silicon oxide film 24, a silicon nitride film 25 is deposited as a first insulating film. In a transistor region, a resist mask RP6 is formed exposing at least a partial region of the transistor region, and the silicon nitride film 25 is etched by RIE to form side wall spacers SW. The resist mask RP6 is thereafter removed. After the process shown in FIG. 7A, the process shown in FIG. 5G is executed.

FIG. 7B is a cross sectional view corresponding to FIG. 5I. An opening forming process for the second insulating film shown in FIG. 5H is not executed. A lamination structure of the first insulating film 25 of silicon nitride and the second insulating film 26 of silicon nitride is therefore formed on the photodiode. Since the films of the lamination structure are the same silicon nitride film, it is possible not to form an optical interface. Thereafter, a process similar to that shown in FIG. 5I is executed to obtain the structure shown in FIG. 7B. Thereafter, similar to the first embodiment, a multi-layer wiring structure, color filters and micro lenses are formed to complete a semiconductor image sensor.

In this embodiment, the photodiode is covered with two silicon nitride layers 25 and 26. In order to suppress light attenuation in the silicon nitride film, at least one of the silicon nitride films 25 and 26 is preferably formed by low temperature, low pressure (LP) CVD which forms the silicon nitride film at a low temperature of about 500° C.

In this embodiment, the silicon surface of the photodiode is covered with the silicon nitride film and a silicon oxide film having a lower refractive index is formed on the silicon nitride film. Interfaces providing gradually lowered refractive indices are formed between silicon, silicon nitride and silicon oxide, so that reflection at the interface is expected to be reduced.

Since light attenuation is reduced in the silicon nitride film formed by low temperature LP-CVD, an improved sensitivity is expected. Since the etch stopper is formed on a semiconductor surface of a transistor with side wall spacers, a borderless contact can be realized. It may be possible to enhance the hydrogen annealing effects by removing the silicon nitride film in the area not adversely affecting the function of the photodiode.

The present invention has been described in connection with the preferred embodiments. The invention is not limited only to the above embodiments. It will be apparent to those skilled in the art that other various modifications, improvements, combinations, and the like can be made.

What are claimed are:

1. A semiconductor image sensor comprising:
   a semiconductor substrate having a number of pixels, said semiconductor substrate comprising a first region including a charge accumulation region of a photodiode, a floating diffusion, and a first isolation region formed in the semiconductor substrate, and a second region including transistors and a second isolation region formed in the semiconductor substrate, each having a gate electrode and source/drain regions;
   a first silicon oxide film formed on said semiconductor substrate, covering a surface of said charge accumulation region in said first region and patterned as side wall spacers remaining on side walls of the gate electrode of at least some transistors in said second region;
   a silicon nitride film formed on said first silicon oxide film, directly contacting the source/drain regions outside said side wall spacers in said second region and having an opening at least in an area above said charge accumulation region in said first region;
   a first conductive plug penetrating through both said silicon oxide film and said silicon nitride film, and contacting with the floating diffusion and not contacting with the first isolation region; and
   a second conductive plug penetrating through said silicon nitride film and contacting with the source/drain regions of said at least some transistors in said second region and the second isolation region.

2. The semiconductor image sensor according to claim 1, further comprising a second silicon oxide film having a thickness of 30 nm or thinner and formed between said silicon nitride film and the source/drain regions of said at least some transistors in said second region.

3. The semiconductor image sensor according to claim 1, further comprising a silicide layer formed on the source/drain regions of said at least some transistors in said second region, wherein said first region does not have said silicide layer.

4. The semiconductor image sensor according to claim 1, wherein said first region includes a portion including a lamination of said first silicon oxide layer and said silicon nitride layer.

5. The semiconductor image sensor according to claim 1, wherein said opening exposes at least a partial area above said floating diffusion.

6. A semiconductor image sensor comprising:
   a semiconductor substrate having a number of pixels, said semiconductor substrate comprising a first region including a charge accumulation region of a photodiode, a floating diffusion, and a first isolation region formed in the semiconductor substrate, and a second region including transistors and a second isolation region formed in the semiconductor substrate, each having a gate electrode and source/drain regions;
   a first silicon nitride film formed above said semiconductor substrate, covering a surface of said charge accumulation region in said first region and patterned as side wall spacers remaining on side walls of the gate electrode of at least some transistors in said second region;
   a second silicon nitride film formed on said first silicon nitride film and directly contacting the source/drain regions outside said side wall spacers of said at least some transistors in said second region;
   a first conductive plug penetrating through both said second silicon nitride film and said first silicon nitride film, and contacting with the floating diffusion and not contacting with the first isolation region; and a second conductive plug penetrating through said second silicon nitride film and contacting with the source/drain regions of said at least some transistors in said second region and the second isolation region.

7. The semiconductor image sensor according to claim 6, wherein at least one of said first and second nitride films is a film formed by low pressure CVD at 550° C. or lower.

8. The semiconductor image sensor according to claim 6, further comprising a silicon oxide film having a thickness of 30 nm or thinner and formed between said second silicon nitride film and the source/drain regions of said at least some transistors in said second region.

9. The semiconductor image sensor according to claim 6, further comprising a silicide layer formed on the source/drain regions of said at least some transistors in said second region, wherein said first region does not have said silicide layer.

10. A semiconductor image sensor comprising:
a semiconductor substrate having a number of pixels, said semiconductor substrate comprising a first region including a charge accumulation region of a photodiode, a floating diffusion, and a first isolation region formed in the semiconductor substrate, and a second region including a charge detection circuit for detecting charge transferred from said charge accumulation region to said floating diffusion, said charge detection circuit being constituted of transistors and a second isolation region formed in the semiconductor substrate, each having a gate electrode and source/drain regions;
a first insulating film formed on said semiconductor substrate, covering a surface of said charge accumulation region in said first region and patterned as side wall spacers remaining on side walls of the gate electrode of at least some transistors in said second region;
a second insulating film formed on said first insulating film and directly contacting the source/drain regions outside said side wall spacers of said at least some transistors in said second region;
a first conductive plug penetrating through both said second insulating film and said first insulating film, and contacting with the floating diffusion and not contacting with the first isolation region; and
a second conductive plug penetrating through said second insulating film and contacting with the source/drain regions of said at least some transistors in said second region and the second isolation region.

11. The semiconductor image sensor according to claim 10, wherein said first and second insulating films are made of different materials.

12. The semiconductor image sensor according to claim 11, wherein said first insulating film is a silicon oxide film and said second insulating film is a silicon nitride film.

13. The semiconductor image sensor according to claim 10, wherein said second insulating film has an opening at least in an area above said charge accumulation region in said first region.

14. The semiconductor image sensor according to claim 12, wherein said first and second insulating films are made of silicon nitride or silicon oxynitride.

15. The semiconductor image sensor according to claim 10, further comprising a silicide layer formed on the source/drain regions of said at least some transistors in said second region, wherein said first region does not have said silicide layer.

* * * * *